(12) United States Patent
Hsu

(10) Patent No.: US 8,205,918 B2
(45) Date of Patent: *Jun. 26, 2012

(54) LOCKING STRUCTURE

(75) Inventor: Yung-Chin Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 629 days.

This patent is subject to a terminal disclaimer.

(21) Appl. No.: 12/396,627

(22) Filed: Mar. 3, 2009

(65) Prior Publication Data

US 2010/0126237 A1   May 27, 2010

(30) Foreign Application Priority Data

Nov. 27, 2008   (CN) .......................... 2008 1 0178372

(51) Int. Cl.
*E05C 19/06* (2006.01)
*E05C 19/00* (2006.01)

(52) U.S. Cl. .................... 292/83; 292/80; 292/DIG. 63; 312/223.1

(58) Field of Classification Search .................... 292/80, 292/81, 83, 87, 89, DIG. 63; 312/223.1; 361/679.58

See application file for complete search history.

(56) References Cited

U.S. PATENT DOCUMENTS

| | | | | |
|---|---|---|---|---|
| 5,056,846 A * | 10/1991 | Tanaka | .......................... | 296/37.1 |
| 5,220,712 A * | 6/1993 | Taki et al. | ........................ | 24/614 |
| 5,918,956 A * | 7/1999 | Scholder | .................... | 312/223.2 |
| 6,814,377 B2 * | 11/2004 | Silverman et al. | .............. | 292/83 |
| 2007/0085453 A1 * | 4/2007 | Zhang et al. | .................... | 312/7.2 |

* cited by examiner

*Primary Examiner* — Carlos Lugo
(74) *Attorney, Agent, or Firm* — J.C. Patents

(57) ABSTRACT

A locking structure applied on a board sliding in a track. The board has locating hole. The locking structure includes a moving member and a locking plate respectively disposed on the board. The moving member has a pull ring portion, a first extending arm, a second extending arm, a first contact portion and a second contact portion. The locking plate has a first engaging arm and a second engaging arm, wherein the first engaging arm leans against the first contact portion and the second engaging arm leans against the second contact portion when a loading is applied to the moving member via the pull ring portion to push the moving member from an initial position to a disengaging position. The first extending arm and the second extending arm apply a resilient force to drive the moving member from the disengaging position back to the initial position.

11 Claims, 7 Drawing Sheets

LOCKING STRUCTURE

CROSS-REFERENCE TO RELATED APPLICATION

This application claims the priority benefit of China application serial no. 200810178372.8, filed on Nov. 27, 2008. The entirety of the above-mentioned patent application is hereby incorporated by reference herein and made a part of specification.

BACKGROUND OF THE INVENTION

1. Field of the Invention

The present invention generally relates to a locking structure. More particularly, the present invention relates to a locking structure applied to a board sliding in a track.

2. Description of Related Art

Recently, the commonly used server host in the industry is mainly a stackable and serially connected rack mount computer host. In the design, the size of a main board in the computer host is greatly reduced, a CPU, a chipset, a memory, and a hard disk are respectively disposed, and then the computer host is guided by a slide rail, so as to be assembled in the rack, such that the space is saved and it is conveniently for replacement. In order to transmit signals, a plurality of connector slots is disposed on the main board of the transmit signal, such that it is conveniently for the main board to serially connect to another main board (or an adapting board), thereby increasing multiplexity of the server, and achieving the high operation performance.

However, the server case is usually flat cuboid, and the sockets on the main board are disposed in a narrow space on the back side of the case, thus resulting in the inconvenience of inserting and extracting the connector. Especially, in the process of extracting the connector, complicated steps and particular tools are required, which is inconvenient to users.

SUMMARY OF THE INVENTION

Accordingly, the present invention is directed to a locking structure for a convenient disengaging operation.

As embodied and broadly described herein, the present invention provides a locking structure applied to a board sliding in a track. The board has a locating hole. The locking structure comprises a moving member and a locking plate respectively disposed on the board. The moving member has a pull ring portion, a first extending arm, a second extending arm, a first contact portion and a second contact portion. The locking plate has a first engaging arm and a second engaging arm, wherein the first engaging arm leans against the first contact portion in normal condition, and the second engaging arm leans against the second contact portion in normal condition, in which the pull ring portion, the first engaging arm and the second engaging arm are in an initial position. When the pull ring portion is driven by a force to move from the initial position to a side of the locating hole, the first contact portion and the second contact portion respectively push the first engaging arm and the second engaging arm, and the first extending arm and the second extending arm elastically deform to make the moving member being at a disengaging position. When the moving member is at the disengaging position, the first extending arm and the second extending arm provide a resilient force to return the moving member from the disengaging position to the initial position.

According to an embodiment of the present invention, the pull ring portion has an applying hole having a profile identical to that of the locating hole of the board, when the pull ring portion locates on the initial position, the applying hole and the locating hole partially overlap with each other, and when the pull ring portion moves to the side of the locating hole, the overlap area between the applying hole and the locating hole increases.

According to an embodiment of the present invention, the board has a first slot and a second slot, a part of the first engaging arm protrudes to the first slot to form a first hook, and a part of the second engaging arm protrudes to the second slot to form a second hook. The first hook is engaged in a first indentation of the track, and the second hook is engaged in a second indentation of the track.

According to an embodiment of the present invention, the locking plate has a connecting portion, the first engaging arm and the second engaging arm are respectively located at two opposite sides of the connecting portion and both extend in a same direction, the first engaging arm has a first leaning surface in contact with the first contact portion, and the second engaging arm has a second leaning surface in contact with the first contact portion.

According to an embodiment of the present invention, the locking plate is fixed on a surface of the board, the moving member slides on the surface of the board horizontally, and the board has at least one holding portion shaped in an arch on the surface for holding the moving member in normal condition.

According to an embodiment of the present invention, the moving member has a protrusion inserted into the holding portion and interfering with the holding portion in a normal direction of the surface, by which the moving member is limited to slide horizontally on the surface of the board.

According to an embodiment of the present invention, the board has a first stopper and a second stopper respectively lean against the first stopper and the second stopper, and when the moving member is at the disengaging position, the first extending arm and the second extending arm respectively interfere with the first stopper and the second stopper and make an elastic deformation.

According to an embodiment of the present invention, the first extending arm and the second extending arm are resilient planks, the first extending arm extends from the first contact portion to the second contact portion, the second extending arm extends from the second contact portion to the first contact portion, and a length of the first extending arm and the second extending arm is substantially equal to a distance between the first contact portion and the second contact portion.

According to an embodiment of the present invention, the locking structure further comprises a partition installed on the board and located above the moving member, wherein the partition and the locking plate are integrally formed, and the partition has a fixing portion fixed on the board.

Accordingly, in the locking structure of the present invention, users can perform a disengaging action by only driving the pull ring portion of the moving member towards the locating hole of the board without any redundant steps and particular tools. The locking structure may further has a first extending arm and a second extending arm capable of providing resilient force to return the locking structure from a disengaging state to an initial state automatically.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
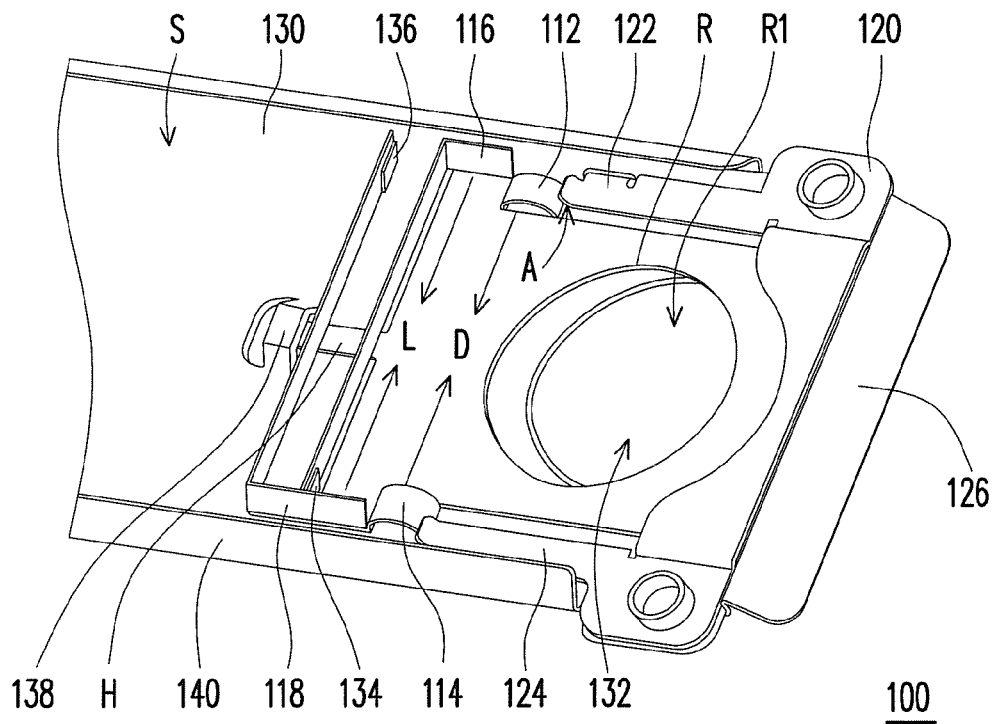
FIG. 1 is a perspective view of a locking structure in an initial state according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a perspective view of a locking structure in an initial state according to an embodiment of the present invention. Referring to FIG. 1, the locking structure 100 is applied to a board 130 sliding in a track 140. The board 130 has a locating hole 132. The locking structure 100 comprises a moving member 110 and a locking plate 120, which are respectively disposed on the board 130. The moving member 110 has a pull ring portion R, a first contact portion 112, a second contact portion 114, a first extending arm 116 and a second extending arm 118, while the locking plate 120 has a first engaging arm 122 and a second engaging arm 124.

A normal condition is defined in the situation that there are no external force applied on the locking structure 100. The first engaging arm 122 and the second engaging arm 124 respectively lean against the first contact portion 114 and the second contact portion 116 in normal condition, wherein the pull ring portion R, the first engaging arm 122, the second engaging arm 124 are in an initial position. The surface S of the board 130 has a holding portion 138 for limiting the sliding range of the moving member 110. The moving member 110 locates between the holding portion 138 and the locking plate 120 in the initial position.

In this embodiment, the locking plate 120 has a connecting portion 126 fixed in the board 130 by riveting or screwing, by which the locking plate 120 is reliably fixed on the surface S of the board 130 and the stroke of the moving member 110 is limited by the connecting portion 126 over the board 130. The first engaging arm 122 and the second engaging arm 124 are respectively disposed at two opposite sides of the connecting portion 126, and both extends in a same direction. The first engaging arm 122 and the second engaging arm 124 respectively lean against the first contact portion 112 and the second contact portion 114 with a leaning surface A.

Except the locking plate 120, the holding portion 138 of the board 130 also has the function of limiting the moving range of the moving member 110. In this embodiment, the holding portion 138 takes a shape in an arch. However, the practical shape of holding portion is not limited thereto, and the holding portion can also be another shape. In addition, the moving member 110 may have a protrusion H protruding below the holding portion 138. The thickness of protrusion H approximates the height of the holding portion 138 to restrict the movement of the protrusion H along a direction orthogonal to the surface S and thereby limit the moving member 110 to slide horizontally on the surface S along a direction parallel to the surface S of the board 130.

In this embodiment, the board 130 further has a first stopper 134 and a second stopper 136. In the normal condition, the first extending arm 116 extends from the first contact portion 112 to the second contact portion 114 and leans against first stopper 134. The second extending arm 118 extends from the second contact portion 114 to the first contact portion 112 and leans against second stopper 136. The length L of the first extending arm 116 and the second extending arm 118 is substantially equal to the distance D between the first contact portion 112 and the second contact portion 114.

Figure 2:
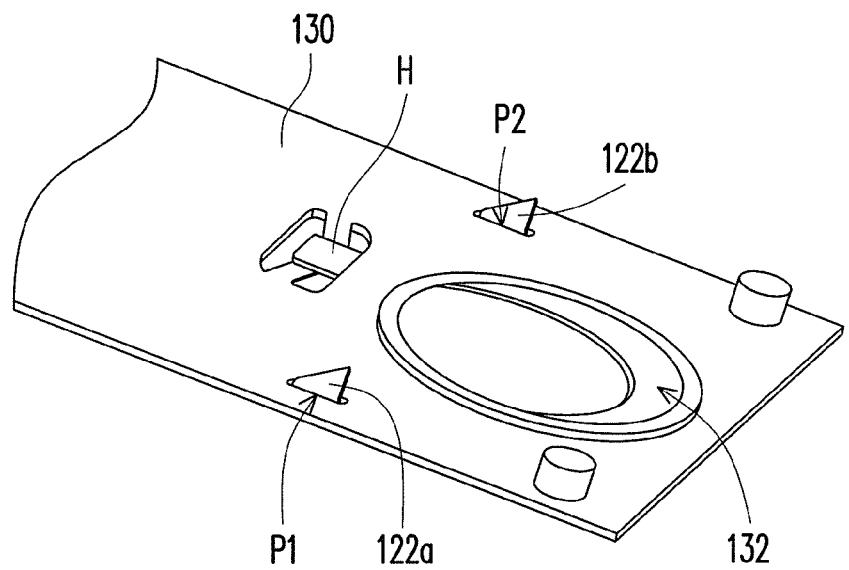
FIG. 2 is a bottom view of the board according an embodiment of the present invention.
Figure 3:
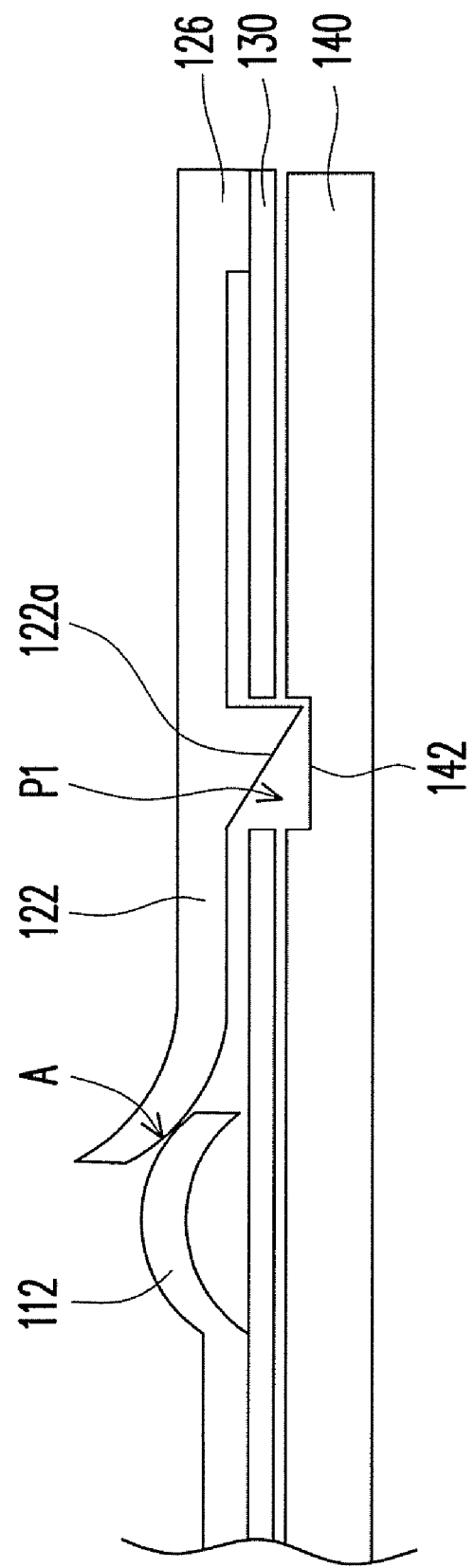
FIG. 3 is a sectional view showing the first contact portion and the first engaging arm of FIG. 1 at the initial position.

FIG. 2 is a bottom view of the board according an embodiment of the present invention. FIG. 3 is a sectional view showing the first contact portion and the first engaging arm of FIG. 1 at the initial position. Referring to FIG. 2 and FIG. 3, the board 130 has a first slot P1 and a second slot P2. A part of the first engaging arm 122 and a part of second engaging arm 124 respectively extend to form a first hook 122a and a second hook 124a passing through the first slot P1 and the second slot P2. When the locking structure 100 is at the initial position, the first hook 122a and the second hook 124a are respectively engaged in the first indentation 142 and the second indentation (not shown) to locate the board 130 on the track 140. However, the profile of the first hook 122a and the second hook 124a are not limited to that of FIG. 3.

Figure 4:
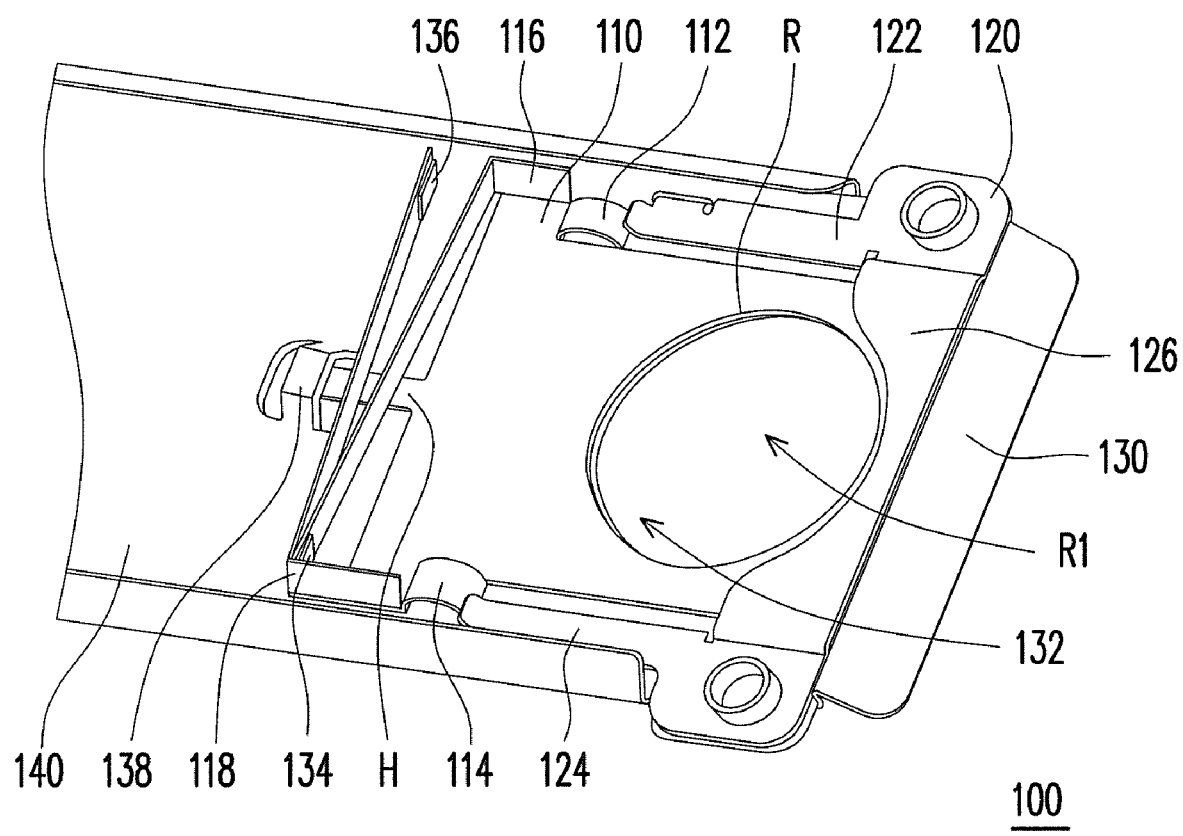
FIG. 4 is a perspective view showing the locking structure located at the disengaging position.
Figure 5:
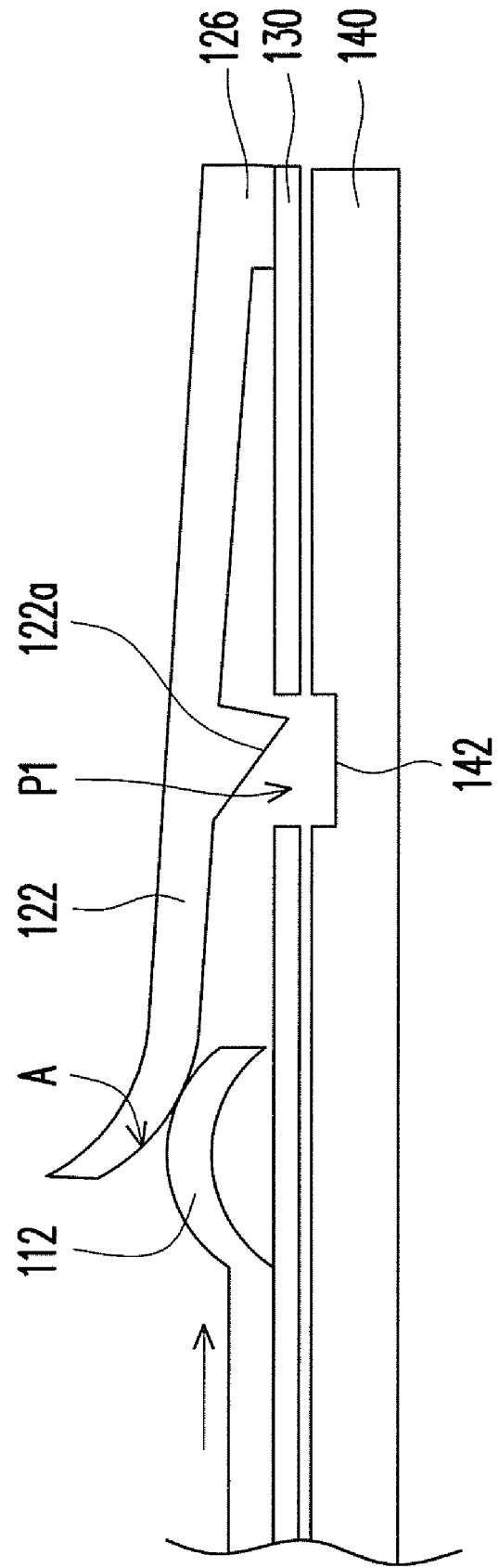
FIG. 5 is a sectional view of the first contact portion and the first engaging arm at the disengaging position of FIG. 4.

FIG. 4 is a perspective view showing the locking structure located at the disengaging position. FIG. 5 is a sectional view of the first contact portion and the first engaging arm at the disengaging position of FIG. 4. Referring to FIG. 4 and 5, the pull ring portion R of the moving member 110 has an applying hole R1. In the normal condition, the overlap area between the applying hole R1 and the locating hole 132 should allow an user's finger inserting therein to applying a force to the pull ring portion R. In the disengaging operation of the locking structure 100, the pull ring portion R is pushed from the initial position to a side of the locating hole 132, and the overlap area between the applying hole R1 and the locating hole 132 increases. In the meantime, the first contact portion 114 and the second contact portion 116 respectively lean against the first engaging arm 122 and the second engaging arm 124, and thereby the first hook 122a and the second hook 124a gradually depart from the first indentation 142 and the second indentation.

When the applying hole 112a ad the locating hole 132 are completely overlap, the first hook 122a and the second hook 124a entirely leave the first indentation 142 and the second indentation, and the locking structure 100 is at the disengaging position. At this time, the board 130 can be extracted from the track 140 by further applying a pulling force to the applying hole R1 along a direction toward the locating hole 132. Furthermore, the applying hole R1 and the locating hole 132 can be set but not limited to having the same identical profile, so that the user can apply force to the pull ring portion R and the board 130 easily and conveniently when the applying hole R1 and the locating hole 132 completely overlap.

In this embodiment, the first extending arm 112 and the second extending arm 114 are resilient planks and are in sufficient dimensions to possess resilient force without conducting any extra works such as annealing or hardening process to the first extending arm 112 and the second extending arm 114. When the moving member 110 is at the disengaging position, the first extending arm 116 and the second extending arm 118 respectively lean against the first stopper 134 and the second stopper 136, and make an elastic deformation to provide a resilient force. When the user removes the applied force on the pull ring portion R, the moving member 110 goes back to the initial position by the resilient force. In addition, the positions of the first stopper 134 and the second stopper 136 restrict the moving range of the first extending arm 116 and the second extending arm 118, and thereby limit the moving member 110 moving over the board 130.

Figure 6:
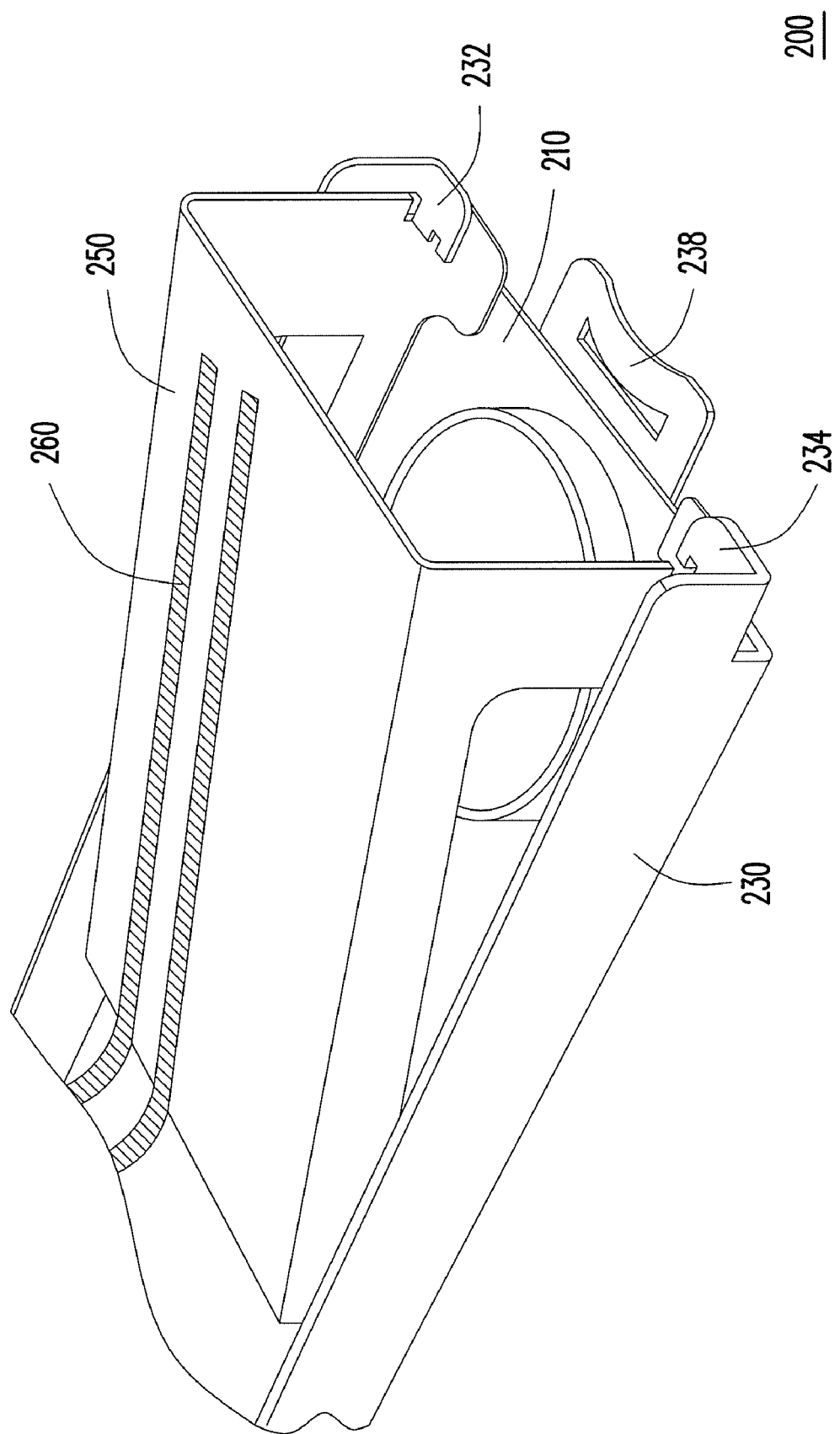
FIG. 6 is a perspective view showing a locking structure according to a second embodiment of the present invention.
Figure 7:
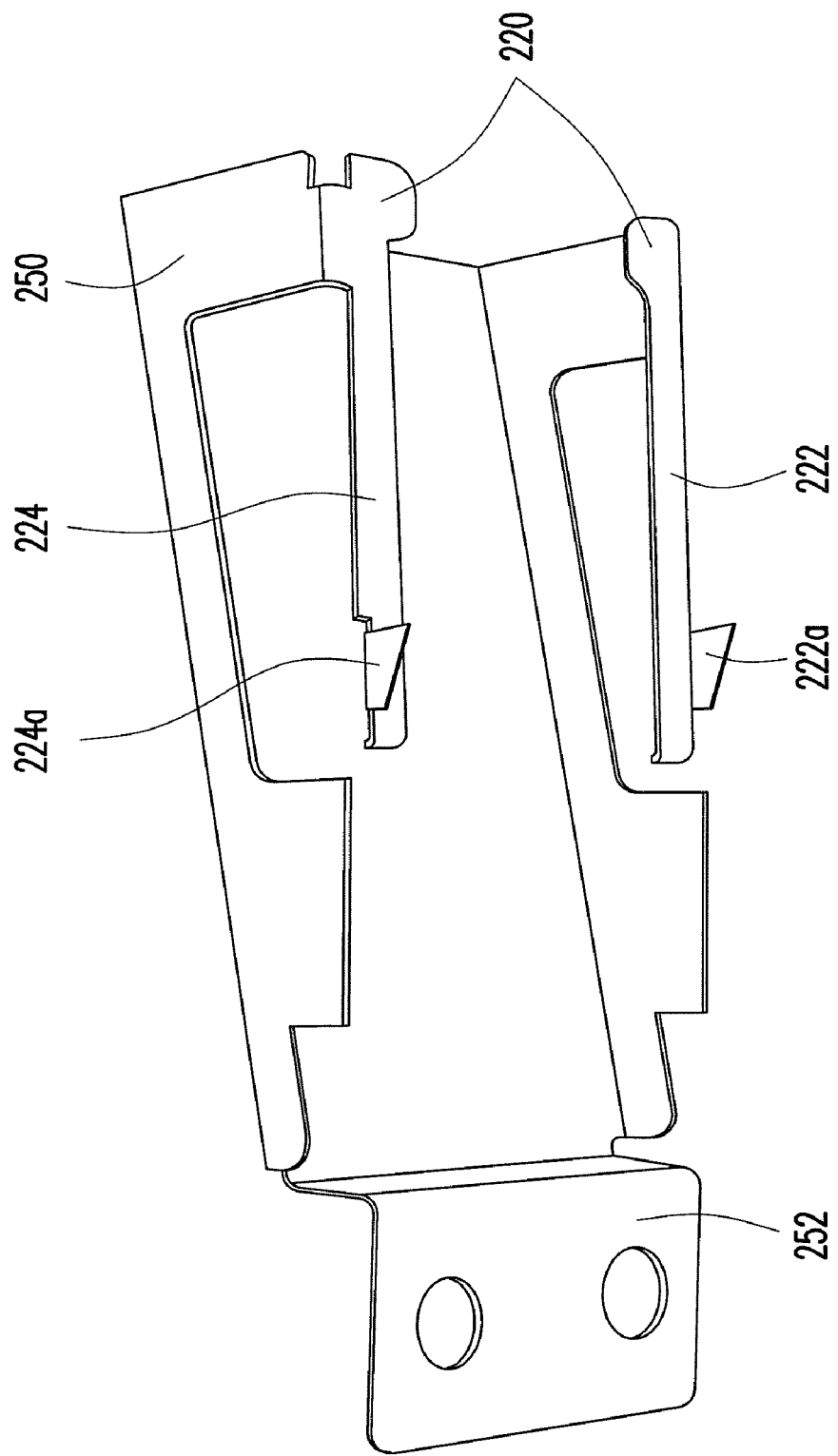
FIG. 7 is a partial view of the locking structure of FIG. 6.

FIG. 6 is a perspective view showing a locking structure according to a second embodiment of the present invention. FIG. 7 is a partial view of the locking structure of FIG. 6. Referring to FIG. 6 and FIG. 7, the moving member 210 of this embodiment is similar to that of FIG. 1, both of them have similar operation manners, and thus only different parts will be illustrate herein and the redundant description will not be repeated again. In this embodiment, the locking structure 200 has a partition 250 provided with a fixing portion 252. The partition 250 is fixed on the board 230 via the fixing portion 252, and the partition 250 is located above the moving member 210 to separate the cable 260 installed on the board 230 from the moving member 210. The partition 250 can retain an operation space above the moving member 210 to ensure the user from interference of the cable 260 when operate the locking structure 200.

In this embodiment, the partition 250 and the locking plate 220 are integrally formed without connecting portion, wherein the partition 250 connect between the first engaging arm 222 and the second engaging arm 224, and both of which respectively have a first hook 222a and a second hook 224a for locating the locking structure 200 on the track.

Figure 8:
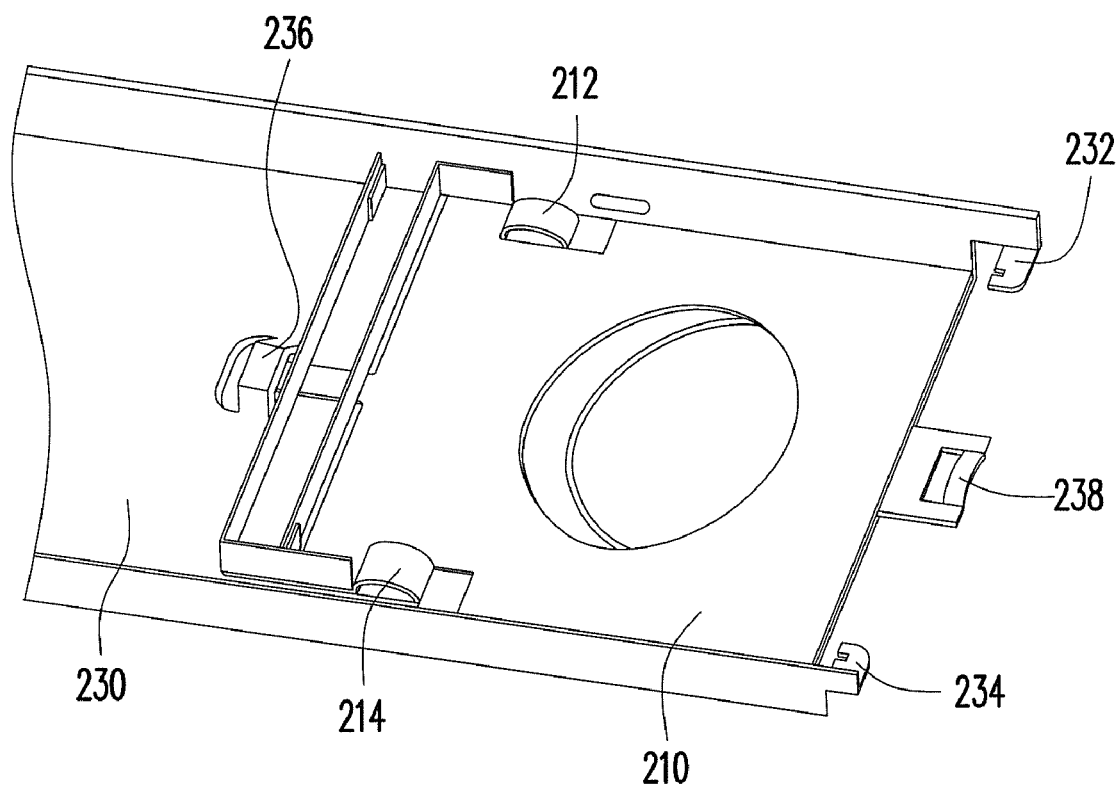
FIG. 8 is a perspective view showing the moving member and the board of the locking structure of FIG. 6.

FIG. 8 is a perspective view showing the moving member and the board of the locking structure of FIG. 6. Referring to FIG. 6 and FIG. 8, since the locking plate 220 of the present embodiment does not have the connecting portion, a second holding portion 238 is formed at an end of the board 230 to instead the locking plate 220 for restricting the moving range of the moving member 210 and preventing the moving member 210 from being extracted to the outside of the board 230.

The board 230 may further have a first clamping portion 232 and a second clamping portion 234, wherein the first clamping portion 232 is engaged at a connecting portion between the partition 250 and the first engaging arm 222, and the second clamping portion 234 is engaged at a connecting portion between the partition 250 and the second engaging arm 224. The first clamping portion 232 and the second clamping portion 234 fix another end of the partition 250 opposite to the fixing portion 252 on the board 230. In this embodiment, the locking plate 220 is fixed on the board 230 via the partition 250, by which the first engaging arm 222 and the second engaging arm 224 are located, and the first hook 222a and the second hook 224a can be reliably engaged with the indentations of the track in the normal condition.

In summary, users can perform a disengaging action by only driving the pull ring portion of the moving member towards the locating hole of the board without any redundant steps and particular tools in a rapid and convenient manner by the locking structure of the present invention. The direction of applying force in the disengaging process is identical to that of extracting the board from the track, and thus a simple operation process can be achieved and damage caused by operational error from users can be prevented.

In addition, when the moving member is at the disengaging position and the user remove the applying force, the moving member suffers the resilient force from the first extending arm and the second extending arm, and the locking structure returns to the initial position to prevent the locking structure from disengagement due to an unexpected or sudden force and ensure the board from being extract from the track.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A locking structure applied to a board sliding in a track, the board having a locating hole, the locking structure comprising:

a moving member and a locking plate, respectively disposed on the board, the moving member having a pull ring portion, a first extending arm, a second extending arm, a first contact portion and a second contact portion, and the locking plate having a first engaging arm and a second engaging arm, wherein the first engaging arm leans against the first contact portion in normal condition, the second engaging arm leans against the second contact portion in normal condition, in which the pull ring portion, the first engaging arm, the second engaging arm are in an initial position, when the pull ring portion is driven by a force to move from the initial position to a side of the locating hole, the first contact portion and the second contact portion respectively push the first engaging arm and the second engaging arm, and the first extending arm and the second extending arm elastically deform to make the moving member be at a disengaging position, and when the moving member is at the disengaging position, the first extending arm and the second extending arm provide a resilient force to return the moving member from the disengaging position to the initial position, wherein the board has a first slot and a second slot, a part of the first engaging arm protrudes to the first slot to form a first hook, and a part of the second engaging arm protrudes to the second slot to form a second hook.

2. The locking structure according to claim 1, wherein the pull ring portion has an applying hole having a profile identical to that of the locating hole of the board, when the pull ring portion locates on the initial position, the applying hole and the locating hole partially overlap with each other, and when the pull ring portion moves to the side of the locating hole, the overlap area between the applying hole and the locating hole increases.

3. The locking structure according to claim 1, wherein the first hook is engaged in a first indentation of the track, and the second hook is engaged in a second indentation of the track.

4. The locking structure according to claim 1, wherein the locking plate has a connecting portion, the first engaging arm and the second engaging arm are respectively located at two opposite sides of the connecting portion and both extend in a same direction, the first engaging arm has a first leaning surface in contact with the first contact portion, and the second engaging arm has a second leaning surface in contact with the first contact portion.

5. The locking structure according to claim 1, wherein the locking plate is fixed on a surface of the board, the moving member slides on the surface of the board horizontally, and the board has at least one holding portion shaped in an arch on the surface for holding the moving member in normal condition.

6. The locking structure according to claim 5, wherein the moving member has a protrusion inserted into the holding portion and interfering with the holding portion in a normal direction of the surface, by which the moving member is limited to slide horizontally on the surface of the board.

7. The locking structure according to claim 1, wherein the board has a first stopper and a second stopper respectively lean against the first stopper and the second stopper, and when the moving member is at the disengaging position, the first extending arm and the second extending arm respectively interfere with the first stopper and the second stopper and make an elastic deformation.

8. The locking structure according to claim 1, wherein the first extending arm and the second extending arm are resilient planks, the first extending arm extends from the first contact portion to the second contact portion, the second extending arm extends from the second contact portion to the first contact portion, and a length of the first extending arm and the second extending arm is substantially equal to a distance between the first contact portion and the second contact portion.

9. A locking structure applied to a board sliding in a track, the board having a locating hole, the locking structure comprising:
  a moving member and a locking plate, respectively disposed on the board, the moving member having a pull ring portion, a first flexible component, a second flexible component, and two contact portions, and the locking plate having two engaging arms, wherein the engaging arms lean against the contact portions in normal condition, in which the pull ring portion, and the engaging arms are in an initial position, when the pull ring portion is driven by a force to move from the initial position to a side of the locating hole, the contact portions push the engaging arms, and the first flexible component and the second flexible component elastically deform to make the moving member be at a disengaging position, and when the moving member is at the disengaging position, the first flexible component and the second flexible component provide a resilient force to return the moving member from the disengaging position to the initial position, wherein the pull ring portion has an applying hole having a profile identical to that of the locating hole of the board, when the pull ring portion locates on the initial position, the applying hole and the locating hole partially overlap with each other, and when the pull ring portion moves to the side of the locating hole, the overlap area between the applying hole and the locating hole increases, wherein the board has two slots, a part of each of the engaging arms protrudes to the slots to form a hook.

10. The locking structure according to claim 9, wherein the locking plate has a connecting portion, the two engaging arms are respectively located at two opposite sides of the connecting portion and both extend in a same direction, and the engaging arms have a leaning surface in contact with the contact portions.

11. The locking structure according to claim 9, wherein the locking plate is fixed on a surface of the board, the moving member slides on the surface of the board horizontally, and the board has at least one holding portion shaped in an arch on the surface for holding the moving member in normal condition.

* * * * *